United States Patent
Farnworth et al.

[11] Patent Number: 5,958,100
[45] Date of Patent: Sep. 28, 1999

[54] PROCESS OF MAKING A GLASS SEMICONDUCTOR PACKAGE

[75] Inventors: Warren M. Farnworth, Nampa; Alan G. Wood, Boise, both of Id.

[73] Assignee: Micron Technology, Inc., Boise, Id.

[21] Appl. No.: 08/692,883

[22] Filed: Jul. 31, 1996

Related U.S. Application Data

[60] Continuation of application No. 08/220,534, Mar. 13, 1994, abandoned, which is a division of application No. 08/072,587, Jun. 3, 1993, abandoned.

[51] Int. Cl.⁶ .......................... C03B 19/00; H01L 21/56; H01L 23/29
[52] U.S. Cl. .......................... 65/47; 65/48; 65/66; 65/85; 65/122; 65/DIG. 11; 257/794; 438/127
[58] Field of Search .................... 65/36, 45, 47, 65/48, 49, 59.1, 66, 83, 85, 137, 138, DIG. 11, 122; 437/213, 219; 257/794, 787, 702, 723, 725; 264/272.17, 272.12, 272.11, 271.1; 438/127

[56] References Cited

U.S. PATENT DOCUMENTS

| | | | |
|---|---|---|---|
| 2,961,350 | 11/1960 | Flaschen et al. | 437/213 |
| 2,998,558 | 8/1961 | Maiden et al. | 257/794 |
| 3,325,586 | 6/1967 | Suddick | 264/272.17 |
| 3,442,999 | 5/1969 | Yamamoto et al. | 437/213 |
| 3,493,405 | 2/1970 | Thomas | 65/DIG. 11 |
| 3,596,136 | 7/1971 | Fischer | 257/794 |
| 3,639,975 | 2/1972 | Teft | 65/DIG. 11 |
| 3,763,300 | 10/1973 | Spanjer | 65/DIG. 11 |
| 4,046,540 | 9/1977 | Lewis et al. | 65/122 |
| 4,133,690 | 1/1979 | Muller | 257/794 |
| 4,285,730 | 8/1981 | Sanford et al. | 501/44 |
| 4,323,654 | 4/1982 | Tick et al. | 501/47 |
| 4,337,182 | 6/1982 | Needham | 264/272.17 |
| 4,362,819 | 12/1982 | Olszewski et al. | 501/44 |
| 4,532,222 | 7/1985 | Butt . | |
| 4,641,418 | 2/1987 | Meddles | 437/219 |
| 4,777,520 | 10/1988 | Nambu et al. | 357/72 |
| 4,818,730 | 4/1989 | Smith, III et al. | 501/15 |
| 4,855,808 | 8/1989 | Tower et al. | 357/74 |
| 4,857,483 | 8/1989 | Steffen et al. | 437/219 |
| 4,897,509 | 1/1990 | Holleran et al. | 174/258 |
| 4,996,170 | 2/1991 | Baird | 437/219 |
| 5,013,360 | 5/1991 | Finkelstein et al. | 106/1.23 |
| 5,018,003 | 5/1991 | Yasunaga et al. | 257/702 |
| 5,080,980 | 1/1992 | Sakaguchi et al. | 428/610 |
| 5,086,334 | 2/1992 | Eberlein | 357/70 |
| 5,089,445 | 2/1992 | Francis | 501/15 |
| 5,089,446 | 2/1992 | Cornelius et al. | 501/15 |
| 5,122,862 | 6/1992 | Kajihara et al. | 357/74 |
| 5,155,299 | 10/1992 | Mahulikar et al. | 174/52.4 |
| 5,177,279 | 1/1992 | Karpman | 357/72 |

FOREIGN PATENT DOCUMENTS

WO 96/20501  7/1996  WIPO .

*Primary Examiner*—Steven P. Griffin
*Attorney, Agent, or Firm*—Ormiston Korfanta & Holland, PLLC

[57] ABSTRACT

A process of making hermetically sealed glass semiconductor packages by injecting molding an electronic device within a body of molten thermoplastic glass which is solidified by cooling. The glass has a sealing temperature not over 350° C. and a CTE not over $110 \times 10^{-7}/°C$. and may be made of tin-phosphorus oxyfluoride or lead sealing glasses.

2 Claims, 4 Drawing Sheets

PROCESS OF MAKING A GLASS SEMICONDUCTOR PACKAGE

This application is a continuation, of application Ser. No. 08/220,534, filed Mar. 13, 1994, now abandoned, which is a division of application Ser. No. 08/072,587, filed Jun. 3, 1993, now abandoned.

FIELD OF THE INVENTION

This invention relates to processes of making semiconductor packages, and more particularly to processes of making glass hermetically sealed semiconductor packages.

BACKGROUND OF THE INVENTION

Semiconductor or integrated circuit devices and assemblies are typically contained in sealed packages to prevent exposure to and damage from their operating environment. Presently, hermetic packages are generally formed from ceramic or metal components bonded together and hermetically sealed with glass or metal. Nonhermetic packages are generally formed from ceramic, metal or plastic components and are usually bonded together and sealed with epoxy. Nonhermetic packages are also formed by molding a plastic body about the semiconductor device. A typical ceramic type hermetic package is illustrated in Karpman, U.S. Pat. No. 5,117,279. Examples of nonhermetic molded plastic and epoxy sealed packages are illustrated in Nambu et al., U.S. Pat. No. 4,777,520 and Mahulikar et al., U.S. Pat. No. 5,155,299, respectively.

The hermetic packages presently in use are much more expensive to produce or procure than are nonhermetic packages. Package cost is particularly important for high density surface mounting, automated mounting and other forms of mass production and assembly of printed circuit boards. Nonhermetic molded plastic packages are the least costly to produce and have been widely adopted for use in mass production of large scale integrated circuits and other semiconductor devices. Plastic packages, however, like other nonhermetic packages, are not adequate for many semiconductor applications because they do not adequately protect the semiconductor device from its operating environment. In addition, molded plastic packages have insufficient thermal conductivity for use in higher power circuits that generate a large quantity of heat during operation. It is desireable to combine the low production/procurement cost and versatility of molded plastic packages with the hermeticity and high thermal conductivity of ceramic or metal glass sealed hermetic packages.

It is also desirable to avoid exposing semiconductor devices to excess heat that may cause damage to some materials present in the device. Conventional materials and assembly processes used to form hermetic seals in ceramic packages often require high temperature processing. For example, high temperatures are often necessary to form a hermetic glass seal between the base and lid of the ceramic package housing. The glass sealing process is typically performed at temperatures of 400° C. to 500° C. and heating times of one to two hours. The relatively high temperatures and heating times are required to cause the glass layer to flow to form the hermetic seal. The high temperature sealing process, however, can cause oxidation of metals used to form electrical leads and other semiconductor components.

The use of moldable glass for covering electronic devices is known in the art. For instance, Suddick, U.S. Pat. No. 3,325,586 and ISEC, British publication no. 1 450 689, describe a glass powder combined with an organic binder and liquid carrier to form a slurry that is dripped on to an electronic device. The slurry is heated to evaporate the binder and fuse the glass to the device. The device is then cooled to solidify the glass. As noted above, the relatively high temperatures necessary to evaporate the binder and fuse the glass may damage materials used in modern electronic devices. In addition, the necessity of adding binders and liquid carriers reduces efficiency and increases the cost of fabricating semiconductor packages. The process of Suddick and ISEC is particularly unsuited to mass production and, as far as the Applicants are aware, this process is not in commercial use.

Fischer, U.S. Pat. No. 3,596,136, discloses a glass dome formed of moldable glass for increasing the transmission of the electrolumniscent light emitted by a diode. The process disclosed in Fischer for molding the glass over the diode does not seal the diode from the external environment. In addition, Fischer is disadvantageous, particularly for mass production, because the device or mold is heated to melt the solid glass bead that is placed on the device or into the mold.

The need to produce more reliable semiconductor devices has lead to the development of assembly processes using low temperature sealing materials. For instance, Karpman, U.S. Pat. No. 5,117,279, discloses a semiconductor package using an ultraviolet-curable epoxy that seals at room temperature. Cornelius et al., U.S. Pat. No. 5,089,446 and Francis, U.S. Pat. No. 5,089,445, disclose tin-phosphorus oxyfluoride and lead sealing glasses, respectively, having sealing temperatures below 350° C. In addition, these sealing glasses are moldable and have coefficients of thermal expansion (CTEs) below $110 \times 10^{-7}$/°C. and closely approximating those of the components in the semiconductor devices. Hence, damage to semiconductor devices caused by the high CTEs of plastic packages is minimized.

A moldable glass semiconductor package has been invented using these new low sealing temperature glasses. The invention combines the hermeticity of glass sealed ceramic packages with the low cost, ease of manufacture and versatility of molded plastic packages. Although these glass packages are not wholly impervious to moisture and, therefore, not totally hermetic, the glass remains impervious to moisture beyond the useful life of most semiconductor devices, including those used in military operations under the most demanding operating conditions and performance requirements. Consequently, these glass packages, as a practical matter, provide a hermetic seal for the life of the semiconductor device packaged therein.

SUMMARY OF THE INVENTION

Accordingly, the general purpose and principal object of the invention is to provide a process of making a hermetically sealed moldable glass semiconductor package that is less costly than ceramic and metal packages.

Another object is to provide a process of making a hermetically sealed moldable glass semiconductor package using glasses having a sealing temperature not over 350° C. and a CTE not over $110 \times 10^{-7}$/°C.

Another object is to provide a process of making a glass semiconductor package that can accommodate various sizes of semiconductor and other electronic devices and elements.

Another object is to provide a process of making a vibration resistance semiconductor package to reduce bond-wire breakage and joint crackage at electrical connections.

Another object is to provide a process of making a semiconductor package whose coefficient of thermal expansion can be varied so as to be compatible with different semiconductor devices and substrate materials.

Another object is to provide a process of making a glass semiconductor package that eliminates the sealing process used for ceramic packages to reduce porosity in the ceramic package materials.

Another object is to provide a process of making a semiconductor package that does not require the use of quartz or other fillers presently used in epoxy/plastic packages and thereby eliminate the risk of damaging bondwires, electrical connections and other components of the semiconductor device caused by filler particles.

According to the present invention, the above and other objects are achieved by a process of making glass semiconductor packages which comprises encapsulating or overlaying an electronic device with a body of molten thermoplastic glass that is solidified by cooling. The body of moldable thermoplastic glass may be formed by variety of processes, such as injection molding, cerdip or blob top chip coating. The moldable thermoplastic glass is impervious to moisture for the useable life of the electronic device, has a sealing temperature not over 350° C. and has a coefficient of thermal expansion not over $110 \times 10^{-7}/°C$. In the preferred embodiment, the moldable glass may be either tin-phosphorus oxyfluoride sealing glass or lead sealing glass.

Other objects, advantages and novel features of the invention will become apparent to those skilled in the art from the following detailed description, wherein we have shown and described only the preferred embodiment of the invention, simply by way of illustrating the best mode contemplated by us of carrying out the invention. As will be realized, the invention is capable of other and different embodiments and use in other than applications, and its several details are capable of modifications in various obvious respects, all without departing from the invention. Accordingly, the drawings and description are to be regarded as illustrative in nature, and not as restrictive.

DETAILED DESCRIPTION OF THE INVENTION

Figure 1:
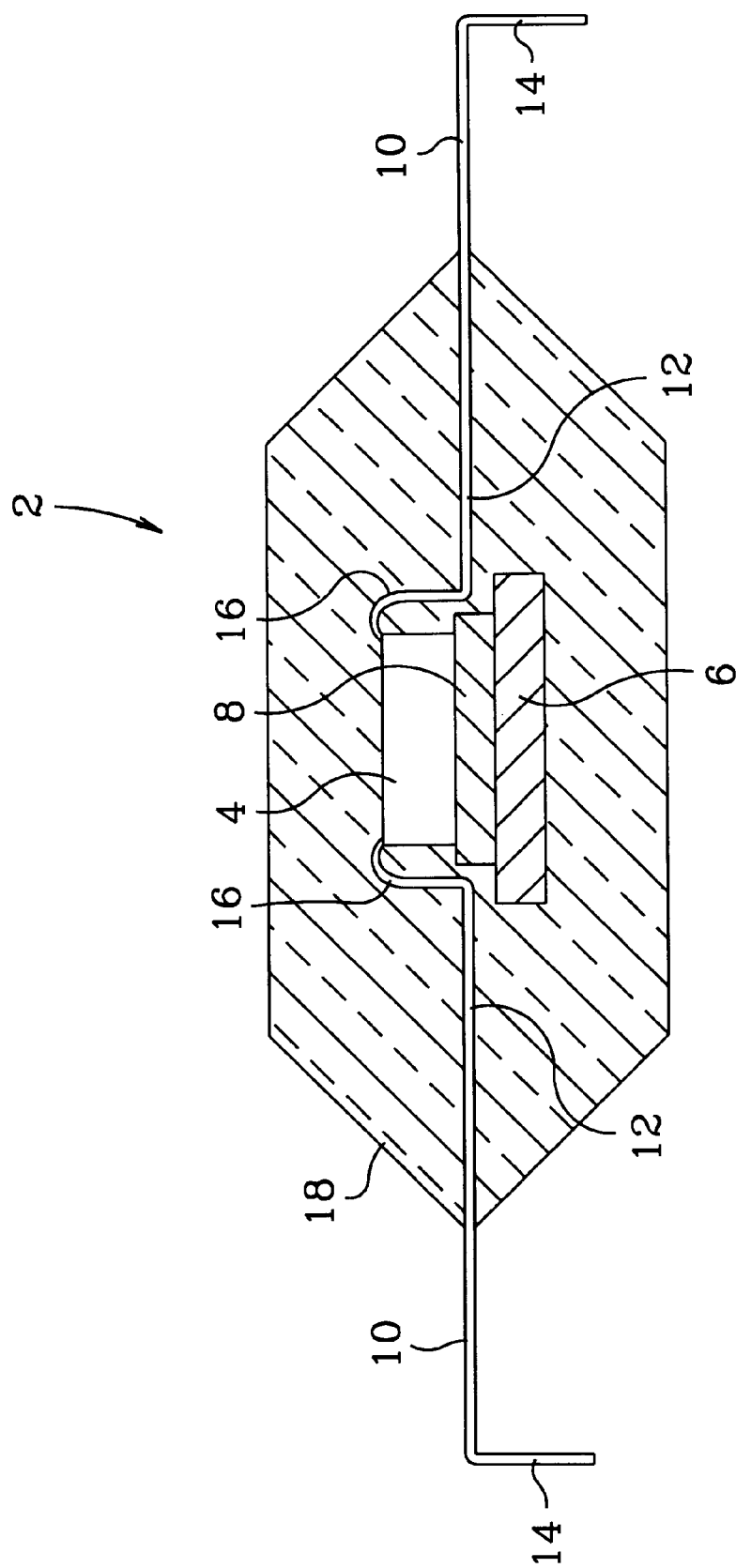
FIG. 1 is a cross-section view of a glass semiconductor package formed using the preferred embodiment of the invention.

FIG. 1 is a cross-section of a glass semiconductor package 2 fabricated using the method of the present invention. A die 4, representing a semiconductor, integrated circuit or other electronic device, is mounted on and bonded to a substrate 6 by a bonding layer 8. A plurality of external leads 10 are disposed around the perimeter of the die 4. Each external lead 10 has an inner end 12 and an outer end 14. Bondwires 16 electrically connect the die 4 to the inner end 12 of each external lead 10. The die 4, substrate 6, bonding layer 8 and inner end 12 of each external lead 10 are encapsulated in a body 18 of molten glass that solidifies as it cools to form the glass semiconductor package 2.

The bondwires 16 may be connected to the die 4 and the inner end 12 of each external lead 10 in any conventional manner such as soldering, gold ball bonding or wedge bonding. The substrate 6 may be made of any suitable material such as fiberglass reinforced board or the die attach pad on a standard leadframe. The bonding layer 8 may be made of thermal epoxy, thermal resin, sealing glass or other suitable material. Preferably, the bonding layer 8 has a sealing temperature above the sealing temperature of the body 18.

Preferably, the body 18 is made of moldable thermoplastic glass having a sealing temperature not over 350° C. and a CTE not over $110 \times 10^{-7}$. The glass may be either tin-phosphorus oxyfluoride glass of the type described in U.S. Pat. No. 5,089,446, incorporated herein by reference, or lead glass of the type described in U.S. Pat. No. 5,089,445, incorporated herein by reference. The CTEs of these glasses may be varied by changing the type and quantity of additives to the base materials to match the CTEs of the components of different types of electronic devices to be packaged. This ability to match CTEs reduces the risk of damaging the electronic device during packaging and, thereby, increases the reliability of such devices. Further, the low sealing temperatures of these glasses minimizes damage to and oxidation of electrical leads and other semiconductor components.

Figure 2:
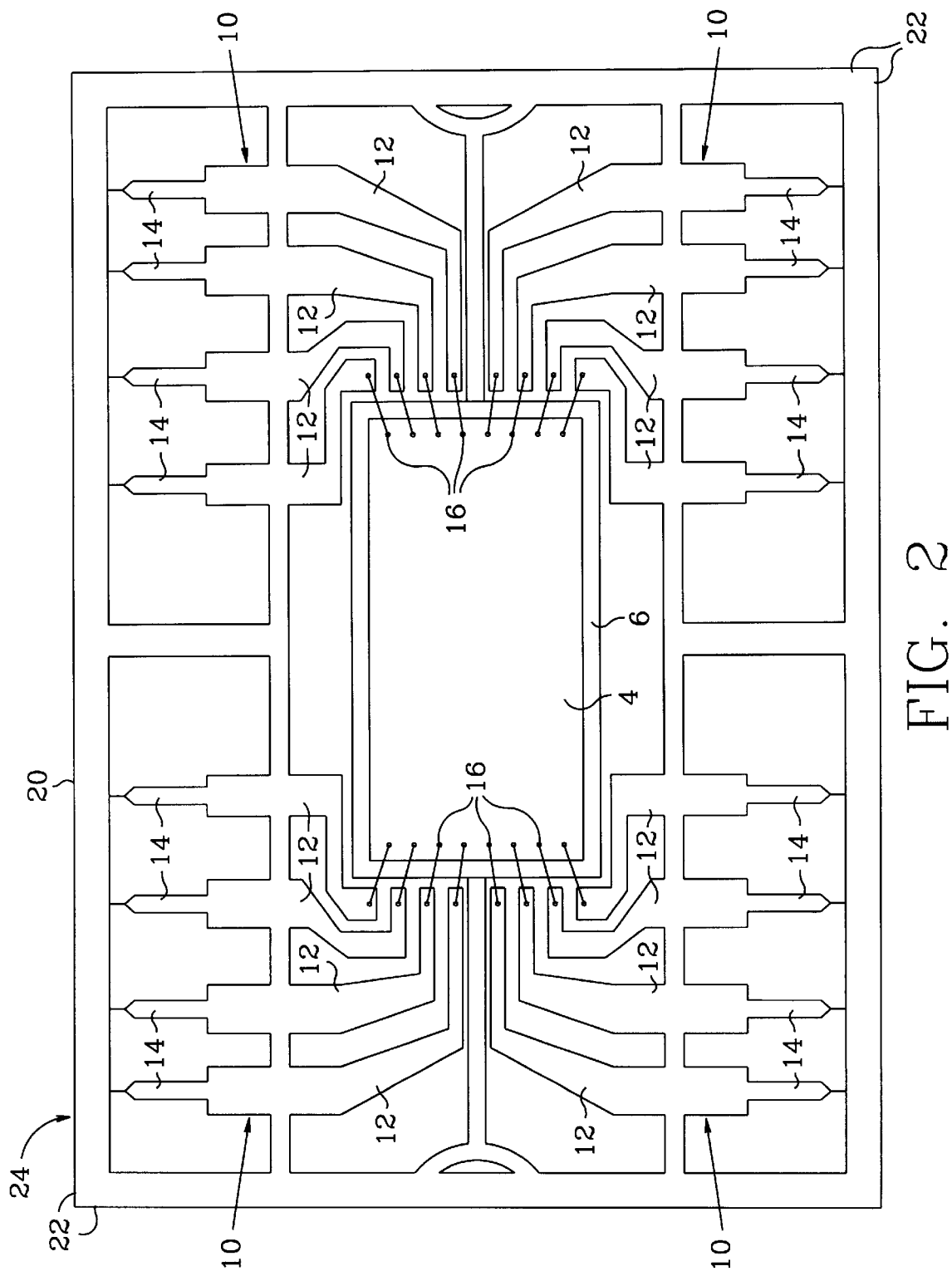
FIG. 2 is a top view of a leadframe assembly.

In the preferred embodiment and referring to FIGS. 1 and 2, a prefabricated leadframe 20 includes substrate 6, external leads 10 and leadframe rails 22. Die 4 is mounted on and bonded to substrate 6 with a bonding layer 8 made of thermal epoxy, thermal resin, sealing glass or other suitable material, to form a leadframe assembly 24. Die 4 is then electrically connected to the inner end 12 of the external leads 10 by bondwires 16. Depending on the type of semiconductor device being packaged, die 4 can be electrically connected to the inner end 12 of the external leads 10 by a wire bond (as shown), by a tape-automated-bond (TAB) bond or by bonding directly to the external leads 10. Although FIG. 1 illustrates a wire bond, it is intended that TAB, direct bonding and other types of electrical connections be included within the scope of the invention.

The leadframe assembly 24 is placed into a mold shaped to form a body 18. Molten thermoplastic glass having a sealing temperature of not more than 350° C. and a CTE of not more than $110 \times 10^{-7}$ is melted and injected into the mold. The molten glass is then allowed to cool (or actively cooled) and solidify to form the body 18 which encapsulates the die 4, substrate 6, bondwires 16 and inner end 12 of the external leads 10. The leadframe assembly 24 is then removed from the mold and the leadframe rails 22 severed from the other components, leaving the completed glass semiconductor package 2. This process of making glass semiconductor packages is particularly advantageous because it may be implemented with fixtures and injection molding equipment currently used for molded thermoset plastic packages or injection molding equipment currently used in the plastics industries.

There accordingly has been described a process for making a semiconductor package providing a hermetically sealed glass package that is less costly to produce than ceramic and metal packages. The process described can accommodate various sizes of semiconductor and other electronic devices and uses glass having sealing temperatures and CTEs that minimize the damage caused by packaging devices and processes currently being used.

Figure 3:
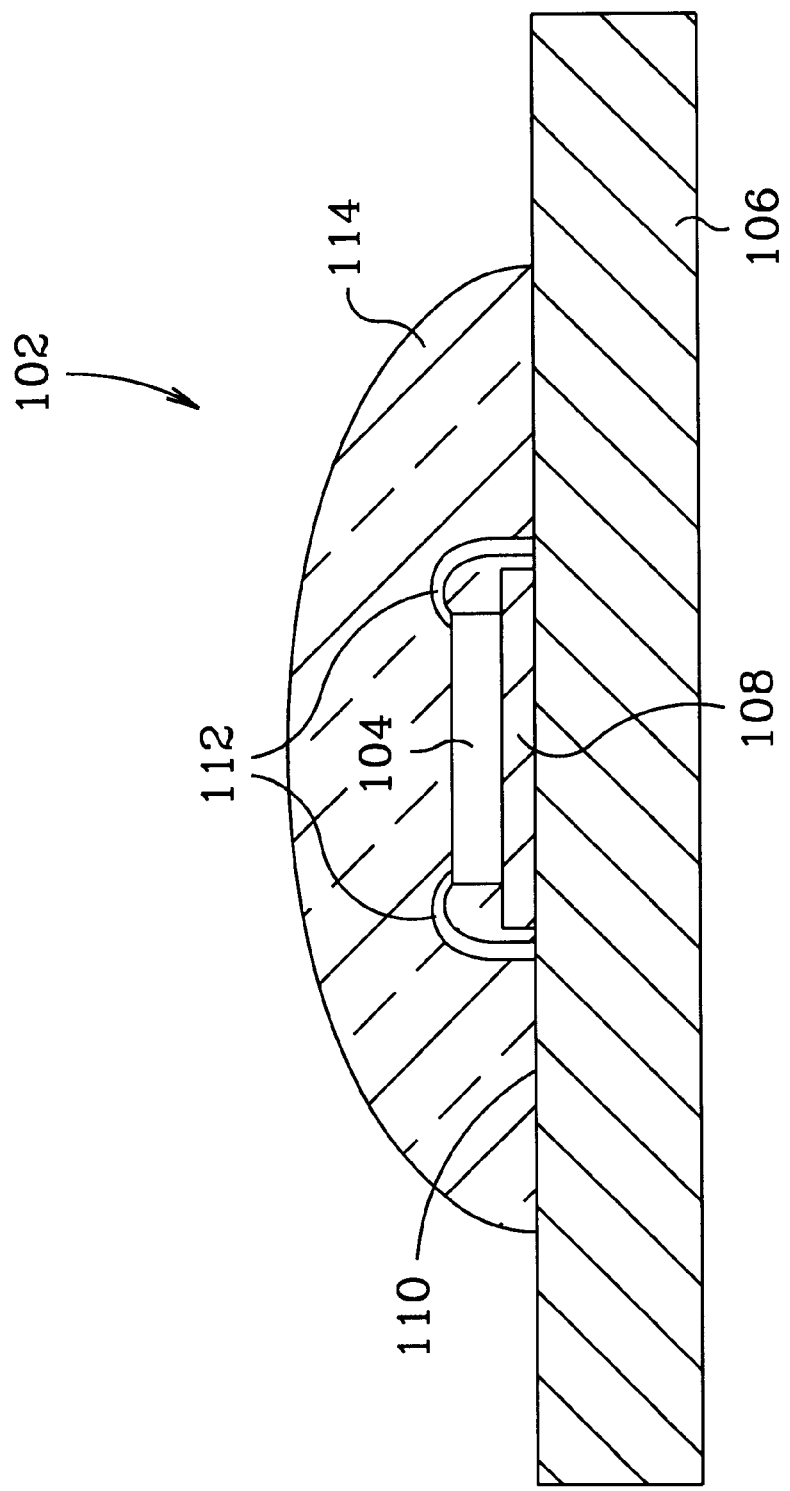
FIG. 3 is a cross-section view of a glass blob top semiconductor package formed using another embodiment of the invention.

The preferred embodiment of the invention achieves the several objects of the invention and are well suited for practical use. Other embodiments of the invention might also be made. For example, FIG. 3 illustrates a blob top glass semiconductor package 102. Referring to FIG. 3, a die 104 is mounted and bonded to a substrate 106 by a bonding layer 108. Substrate 106 has a metalized surface 110. Bondwires 112 electrically connect the die 104 with the metalized surface 110 of the substrate 108. The die 104, bonding layer 108 and bondwires 112 are encapsulated in a body 114. The body 114 is formed by overlaying the die 104 and bondwires 112 with a blob of molten glass which solidifies as it cools. The body 114 is made of glass having a sealing temperature not over 350° C. and a CTE not over $110 \times 10^{-7}$, and may consist of the tin-phosphorus oxyfluoride or lead glasses referenced above.

Figure 4:
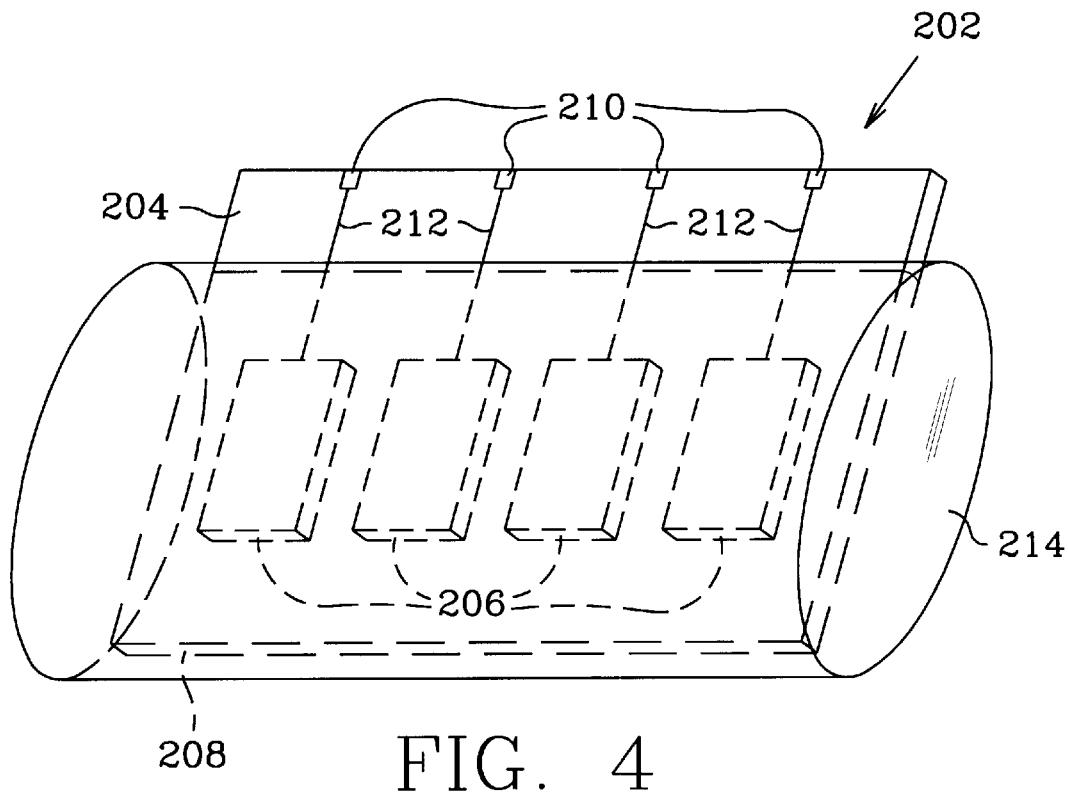
FIG. 4 is a top perspective view of a glass cerdip single in line memory module (SIMM) semiconductor package formed using another embodiment of the invention.
Figure 5:
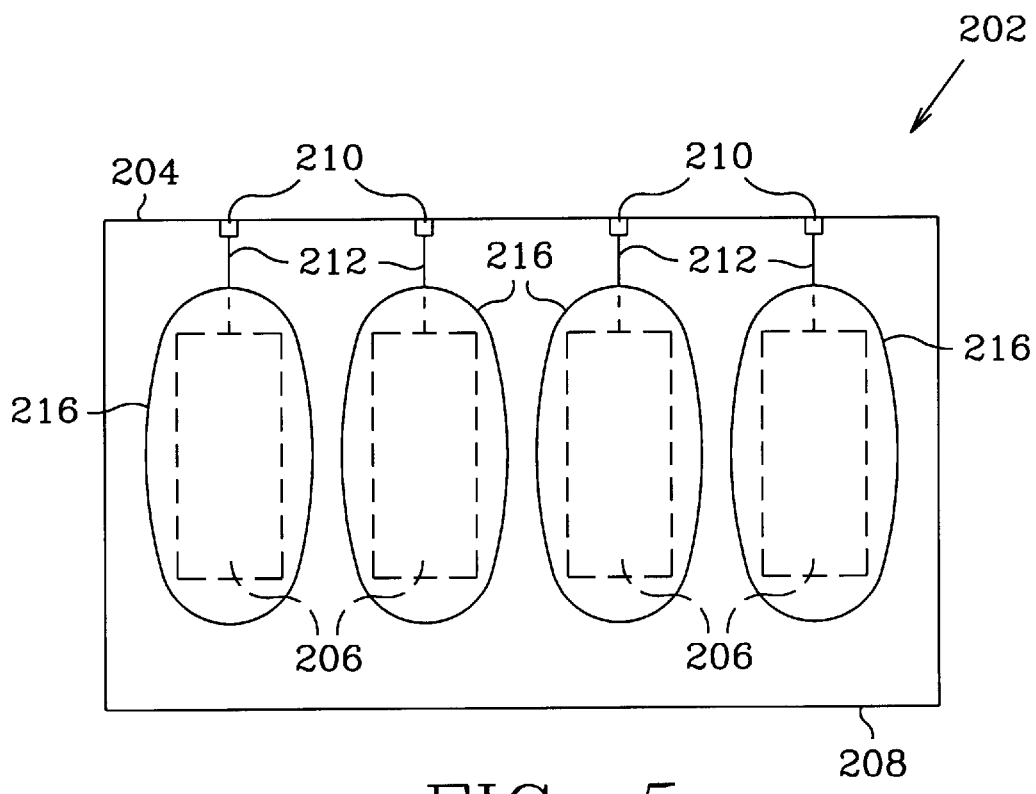
FIG. 5 is a top view of a glass blob top single in line memory module (SIMM) semiconductor package illustrating the use of another embodiment of the invention.

Another embodiment of the invention is illustrated in FIG. 4. FIG. 4 illustrates a glass semiconductor package 202 formed by immersing a single in line memory module (SIMM) 204 or similar assembly in molten glass of the type previously described. A plurality of electronic devices 206 are mounted on a substrate 208. A plurality of electrical contacts 210, corresponding to and located adjacent to the electronic devices 206, are mounted along the edge of the substrate 208. A plurality of bondwires 212 electrically connect the electronic devices 206 to the contacts 210. The electronic devices 206 and a portion of the bondwires 212 and the substrate 208 are immersed in molten glass. The glass contacting these parts cools forming a thin hermetically sealed body 214. The thickness of the body may be varied depending upon the temperature of the parts and the length and number of immersions. Alternatively, and as illustrated in FIG. 5, the electronic devices 206, a portion of the bondwires 212 and a portion of the substrate 206 may be overlaid with a body of molten glass 216.

There is shown and described only the preferred embodiments of the invention and two alternative embodiments, but, as mentioned above, it is to be understood that the invention is capable of use in various other embodiments and applications and is capable of changes or modifications within the scope of the inventive concept as expressed herein.

We claim:

1. A process of making a glass semiconductor package for an electronic device, comprising:

placing the electronic device in a mold;

injecting molten thermoplastic glass consisting essentially of a glass having a sealing temperature not over 350° C. and a coefficient of thermal expansion not over $110 \times 10^{-7}$/°C. into the mold to surround the electronic device with thermoplastic glass; and solidifying the molten thermoplastic glass by cooling after the glass is injected into the mold.

2. A process of making a glass semiconductor package according to claim 1, wherein the thermoplastic glass is a sealing glass selected from the group consisting of: (i) tin-phosphorus oxyflouride glass having a low transition temperature and a mill addition selected from the group consisting of molybdenum, tungsten, lead orthophosphate, magnesium, pyrophosphate, a magnesium pyrophosphate with at least a portion of the magnesium ions replaced by at least one cation selected from the group consisting of cobalt, arsenic, zinc, iron, aluminum and zirconium, and a crystallized phosphate glass consisting essentially of one or more cations selected from the group consisting of magnesium, cobalt, arsenic, zinc, iron, aluminum and zirconium; and (ii) lead sealing glass and a mill addition of a pyrophosphate crystalline material selected from the group consisting of magnesium pyrophosphate, a magnesium pyrophosphate with at least a portion of the magnesium ions replaced by at least one cation selected from the group consisting of cobalt, arsenic, zinc, iron, aluminum and zirconium, and a crystallized phosphate glass consisting essentially of one or more cations selected from the group consisting of magnesium, cobalt, arsenic, zinc, iron, aluminum and zirconium.

* * * * *